United States Patent [19]

Abernathy et al.

[11] Patent Number: 5,175,515
[45] Date of Patent: Dec. 29, 1992

[54] SIGNAL ROUTING TECHNIQUE FOR ELECTRONIC SYSTEMS

[75] Inventors: Michael G. Abernathy; Angie M. Fletcher, both of Spring; Paul Santeler, Cypress; Roy E. Thomas, III, Houston, all of Tex.

[73] Assignee: Compaq Computer Corporation, Houston, Tex.

[21] Appl. No.: 719,119

[22] Filed: Jun. 21, 1991

[51] Int. Cl.⁵ .............................................. H03H 7/48
[52] U.S. Cl. ........................................ 333/4; 174/261; 307/42; 307/482.1; 333/5; 333/100; 361/404
[58] Field of Search ........................ 333/4, 5, 100, 124, 333/125, 136; 307/269, 303, 303.1, 465.1, 482.1, 15, 36, 42; 328/104, 154; 174/250, 260, 261; 361/404, 406, 407

[56] References Cited

U.S. PATENT DOCUMENTS

| | | |
|---|---|---|
| 3,267,394 | 8/1966 | Peil et al. ........................ 333/100 X |
| 3,832,575 | 8/1974 | Dasgupta et al. . |
| 4,575,780 | 3/1986 | Brombal et al. . |
| 4,595,923 | 6/1986 | McFarland, Jr. . |
| 4,785,141 | 11/1988 | Nishihara et al. . |
| 4,853,831 | 8/1989 | Tsuchiya ........................ 361/404 X |
| 5,012,390 | 4/1991 | Erbele . |
| 5,012,427 | 4/1991 | Kuribayashi .................... 307/269 X |
| 5,057,708 | 10/1991 | Tagami et al. . |
| 5,072,132 | 12/1991 | Samaras et al. .............. 307/482.1 X |
| 5,109,168 | 4/1992 | Rusu ............................ 307/465.1 X |
| 5,117,331 | 5/1992 | Gebara ........................... 333/124 X |

OTHER PUBLICATIONS

William R. Blood, Jr., MECL Systems Design Handbook, 1988, pp. 121-172.
Intel Corporation, I486 Microprocessor Hardware Reference Manual, 1990, Chapter 10, pp. 10—10-10-35.

Primary Examiner—Paul Gensler
Attorney, Agent, or Firm—Pravel, Gambrell, Hewitt, Kimball & Krieger

[57] ABSTRACT

An electrical system wherein the electrical conductive traces on the circuit boards are routed to achieve a balanced net to reduce noise caused by transmission line reflections. A trace is routed from the source terminal of the net to a balanced junction wherein if there are an odd number of load terminals, or loads, the balanced junction is located at one of the loads. The remaining loads are grouped into branches wherein each branch includes an equal number of loads. A trace is routed between each of the loads of each branch to serially connect the loads of each branch together, or, a trace is routed from a center one of the branch loads to each of the remaining branch loads, forming subbranches. In an alternate embodiment, a balanced subbranch is developed. The balanced load is connected to a pseudo-balanced load, which further receives an equal number of branches. The pseudo-balanced load is then connected to another pseudo-balanced load, which may also receive an equal number of branches. This pseudo-balanced load is connected to the source. In another alternative, two balanced subbranches have their balanced loads connected to a central balanced load. This balanced load may receive even further numbers of equal branches. The balanced load is connected to the source.

6 Claims, 5 Drawing Sheets

SIGNAL ROUTING TECHNIQUE FOR ELECTRONIC SYSTEMS

BACKGROUND OF THE INVENTION

1. Field of the Invention

The present invention relates to signal routing techniques to reduce transmission line reflections in electronic systems.

2. Description of the Related Art

The personal computer industry is evolving quickly as new innovations occur. The driving force behind this innovation has been the increasing demand for faster and more powerful computers. As technology advances, the density of electronic packaging of electronic components are increasing, and these components are being operated at ever increasing frequencies.

A typical computer or electronic system includes electrical components mounted on one or more printed circuit boards (PCBs). The electrical components communicate with each other through electrical signals provided on electrical conductors or traces routed on the PCB connected to the terminals of the electronic components. As the speed of the electronic system is increased, the routed conductors or traces on the PCBs carrying these signals begin to behave like transmission lines. The rising or falling edges of the higher frequency signals on the traces cause transmission line reflections. At lower frequencies, the reflections are insignificant since the transmission wavelengths of the signal transitions are relatively long compared to the length of the trace, thereby allowing reflections to settle relatively quickly. However, as the signal frequency increases, the signal wavelength approaches the same length as the traces on the PCB, and transmission line reflections become a significant factor causing noise on the signals of the electronic system.

The noise is primarily due to the signals being reflected back and forth on the trace, wherein these reflections can attenuate or reinforce the signal depending upon the phase relationships of the reflections. Signal noise appears in the form of ringing or bouncing, as well as undershoot and overshoot of the signals if the transmission line reflections are not properly compensated. Significant levels of signal noise results in false signal levels on the routed traces appearing at the inputs of the electrical components, eventually leading to failure of the system.

Several routing techniques have been developed to reduce the effects of transmission line reflections in electronic systems, such as daisy chaining between the source and the loads, avoiding 90 degree angles of the traces, and reducing the number of vias between PCB board layers. These techniques are still desirable and should be used when practicing the routing technique of the present invention. Other techniques, such as routing from the source to each load in series and providing an ac or dc terminator at or near the last load, have proved inadequate as the frequency is increased beyond a certain point. An ac terminator usually comprises a resistor and a capacitor coupled in series between the last load of a trace and ground, wherein the value of the resistor and capacitor is chosen to match the impedance of the signal trace together with the loads appearing on the trace. The ac terminator at high frequencies, however, tends to absorb some power, which is undesirable if the source is providing only enough power to drive the loads. Also, having to provide multiple terminators throughout the system substantially increases cost. As the speed of electronic systems increases, new routing techniques are becoming more and more important in order to improve the signal integrity of the systems without adding substantial cost.

The present invention relates to a new signal routing technique for routing traces between signal components in electronic systems, providing reduced transmission line reflections especially at higher frequencies.

SUMMARY OF THE PRESENT INVENTION

Each signal trace on a printed circuit board of an electronic system transmits a signal and includes at least two nodes. A series of nodes and connecting traces form the net of the signal. Typically, each node includes a single driver or source, which provides the signal to one or more receivers, or loads, with the trace forming the net being connected to and routed between the source and the loads. It has been determined that the signal integrity is improved whereby transmission line reflections are reduced if the traces of a signal are routed in such a manner as to provide a balanced node. In one embodiment of the signal routing technique according to the present invention, a single trace is routed from the source to a balanced junction. The loads are divided into several equivalent branches, wherein each branch has an equal number of loads. Traces are routed from the balanced junction to a load of each branch in order to balance the branches around the balanced junction. If there are an odd number of loads in a net, the balanced junction is located at one of the loads, wherein that load becomes a balanced load. In the simplest embodiment, each branch load is individually connected to a balanced load. In other cases the branch loads of each branch may be connected in series with a trace routed from one of the branch loads to each of the remaining branch loads so that all of the loads of that branch are connected in a daisy chain series; the load that is connected to the balanced junction being the first load of the branch.

In an alternative embodiment, the loads can be divided into two branches having an equal and odd number of loads. One load of each branch then serves as a balanced load, which are in turn connected to a balanced load which is connected to the source. Additionally, a further equal number of loads can be connected to the source-connected balanced load.

In another alternate embodiment, a balanced load can be connected loads forming equal branches. This balanced load can be connected to a pseudo-balanced load, which further receives an equal number of loads. This pseudo-balanced load can then in turn be connected to another pseudo-balanced load. This pseudo-balanced load may receive an equal number of loads and may be connected to the signal source.

The following examples further illustrate the signal routing technique of the present invention. If there are five loads, for instance, a trace is routed from the source to one of the loads, serving as a balanced load. The remaining four loads are divided into two branches of two loads each. A trace is routed from the balanced load to one of the two loads of each branch wherein that load serves as the first load and another trace is serially routed from this first load to the other load of each branch.

For an even number of loads, a signal trace is routed from the source to a balanced junction, and the loads are routed so as to be balanced around the balanced junction in a similar fashion as described above. For instance, if there are four loads in the net, a trace is routed from the source to the balanced junction, and the loads are divided into two branches of two loads each, there being no load at the balanced junction. For each branch, a trace is routed between each of the two loads in each branch, and another trace is routed from one of the branch loads to the balanced junction.

In yet another embodiment of the present invention, if there are an odd number of loads, a signal trace is routed between the source and a first load, and another trace between the first load and a balanced junction. The remaining loads are distributed equally around the balanced junction in the same manner as described above. For example, a first trace is routed between the source and the first load, another trace is routed between the first load and the balanced junction, and two or more equal branches are connected to the balanced junction.

In any of the embodiments described above, the transmission line reflections are substantially reduced due to the signal routing technique of the present invention, but are not necessarily completely neutralized. If the source provides significantly more than enough current to drive the loads in a given net, the excess drive capabilities may increase the transmission line reflections at higher frequencies, resulting in compromised signal integrity even if the electronic device is routed using the techniques of the present invention. In this case, an ac terminator could be connected to one or more of the branches so that the combined impedance of all of the branches matches the impedance of the feeder trace routed between the source and the balanced junction. The terminators will further reduce transmission line reflections. On the other hand, if the source provides only lesser amounts of current to drive the loads, which is the case for many nets, the ac terminators are not necessary. Therefore, the routing technique of the present invention significantly reduces the need for ac terminators for impedance matching purposes. In a few nets, however, impedance matching terminators may be used to further reduce transmission line reflections.

In summary, transmission line reflections causing noise on high frequency signals in an electronic system are substantially reduced if the source and loads of each net are connected together forming a balanced net using the signal routing techniques according to the present invention.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1A:
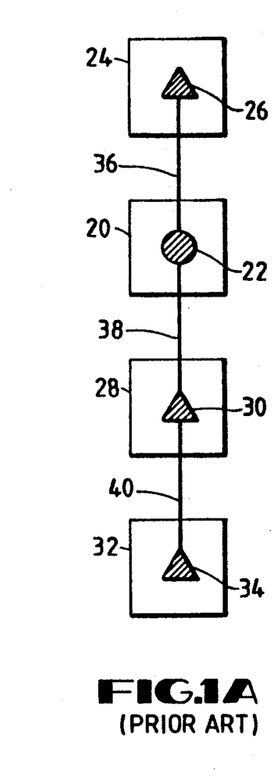
FIGS. 1A-1C are symbolic diagrams illustrating electrical components connected together using signal routing techniques of prior art.
Figure 1B:
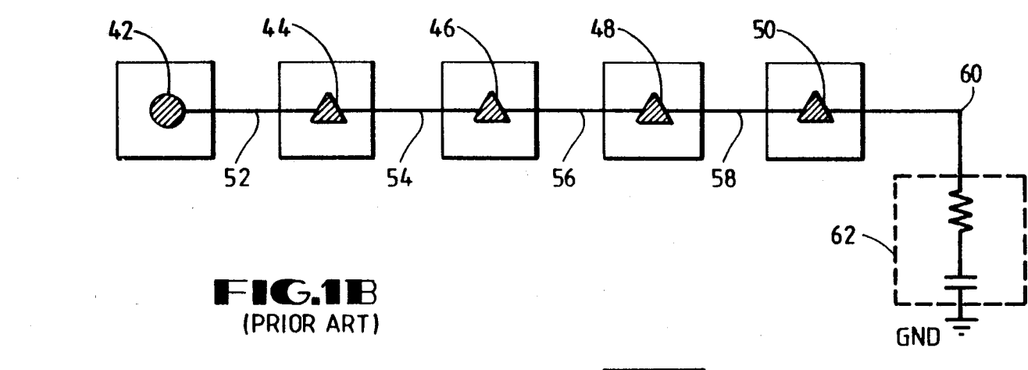
Figure 1C:
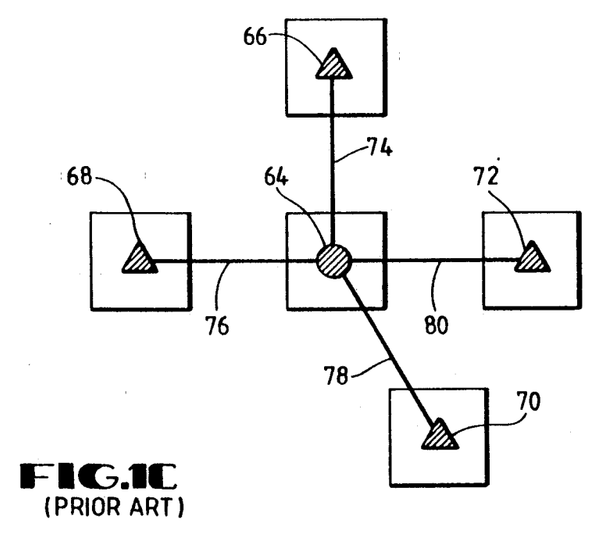

Referring now to FIGS. 1A-1C, symbolic diagrams illustrating electrical components connected together using signal routing techniques of prior art are shown. Each square or block shown in the Figures represents a system component receiving or providing electrical signals. A solid circle represents an output terminal of a component providing an output signal to one or more input terminals of one or more components, and will be referred to herein as a source or source terminal. A solid triangle represents an input terminal of a component of the system receiving a signal provided by a source terminal, and will be referred to herein as a load or load terminal. The lines connecting the sources to the loads represent routed conductors or traces providing a signal path from a source to a load. The lines representing routed traces are not meant to be exact physical representations of the routed traces but merely illustrate the order and geometry of the connections. The general guidelines and techniques of routing conductive traces from one point to the next as well known to those skilled in the art should still be used in conjunction with the routing techniques according to the present invention.

Referring now to FIG. 1A, an electronic device or system component 20 includes an output terminal or source 22 providing a signal to a load 26 of a component 24, to a load 30 of a component 28 and to a load 34 of a component 32. A signal trace 36 is routed between the source 22 and the load 26. Likewise, a signal trace 38 is routed between the source 22 and a load 30 and another signal trace 40 is routed between the load 30 and the load 34. The routing technique as illustrated in FIG. 1A is typical in low frequency electronic systems and generally presents few problems in low frequency applications. The signal traces 36, 38 and 40 are relatively short compared to the long wavelengths of low frequency signals thereby providing few transmission line reflections between the loads 26, 30 and 34, and the source 22. However, as the frequency of the signal provided at the source 22 increases, a significant amount of transmission line reflections occur on the signal traces 36, 38 and 40. Eventually, the transmission line reflections depreciate the signal quality causing ringing or bouncing of the signal on the signal traces 36, 38 and 40, thereby resulting in false signals being received by the loads 26, 30 and 34. The electrical circuitry within the components 24, 28 and 32, therefore, receives incorrect signals which may eventually cause improper operation or failure of an electrical system routed using this method.

Referring now to FIG. 1B, another signal routing technique used in prior art systems is shown. A source 42 provides a signal to several loads 44, 46, 48 and 50. The loads are connected in series in daisy-chain fashion beginning at the source 42 at one end of the net, and ending with the load 50 at the other end. In this manner, a signal trace 52 is routed between the source 42 and the load 44, a trace 54 is routed between the load 44 and the load 46, a trace 56 is routed between the load 46 and the load 48 and a trace 58 is routed between the load 48 and the load 50. The signal trace shown in FIG. 1B is terminated with an ac terminator 62 comprising a resistor and a capacitor coupled in series between the last load 50 and ground. A signal trace 60 is routed between the load 50 and the one input of the terminator 62, and the other side of the terminator 62 is connected to ground. The value of the resistor and capacitor of the terminator 62 is chosen to provide a matching impedance of the signal traces 52-60 as loaded by the loads 44-50. The net routed according to signal routing techniques shown in FIG. 1B provides the better results than the net routed in FIG. 1A wherein the signal line reflections are reduced. Nonetheless, as the frequency is increased, reflections appear on the signal traces 52-60 degrading the overall performance of the electronic system. Also, the ac terminator 62 absorbs valuable power due to capacitive loading, which becomes difficult for the source 42 to drive at higher frequencies.

Referring now to FIG. 1C, another signal routing technique of prior art is shown. A source 64 is providing a signal to several loads 66, 68, 70 and 72 wherein the loads 66-72 are connected together in a star configuration. In this manner, a trace 74 is routed between the source 64 and the load 66, a trace 76 is routed between the source 64 and the load 68, a trace 78 is routed between the source 64 and the load 70, and a trace 80 is routed between the source 64 and the load 72. One or more of the branches from the source 64 to the loads 66-72 may include multiple loads connected in series wherein a terminator similar to the terminator 62 may be used. Again, the routing technique shown in FIG. 1C is adequate for moderate frequencies. However, at higher frequencies, significant amounts of noise from transmission line reflections occur between the loads 66-72 and the source 64, eventually potentially causing erroneous operation or failure of an electronic system.

Figure 2:
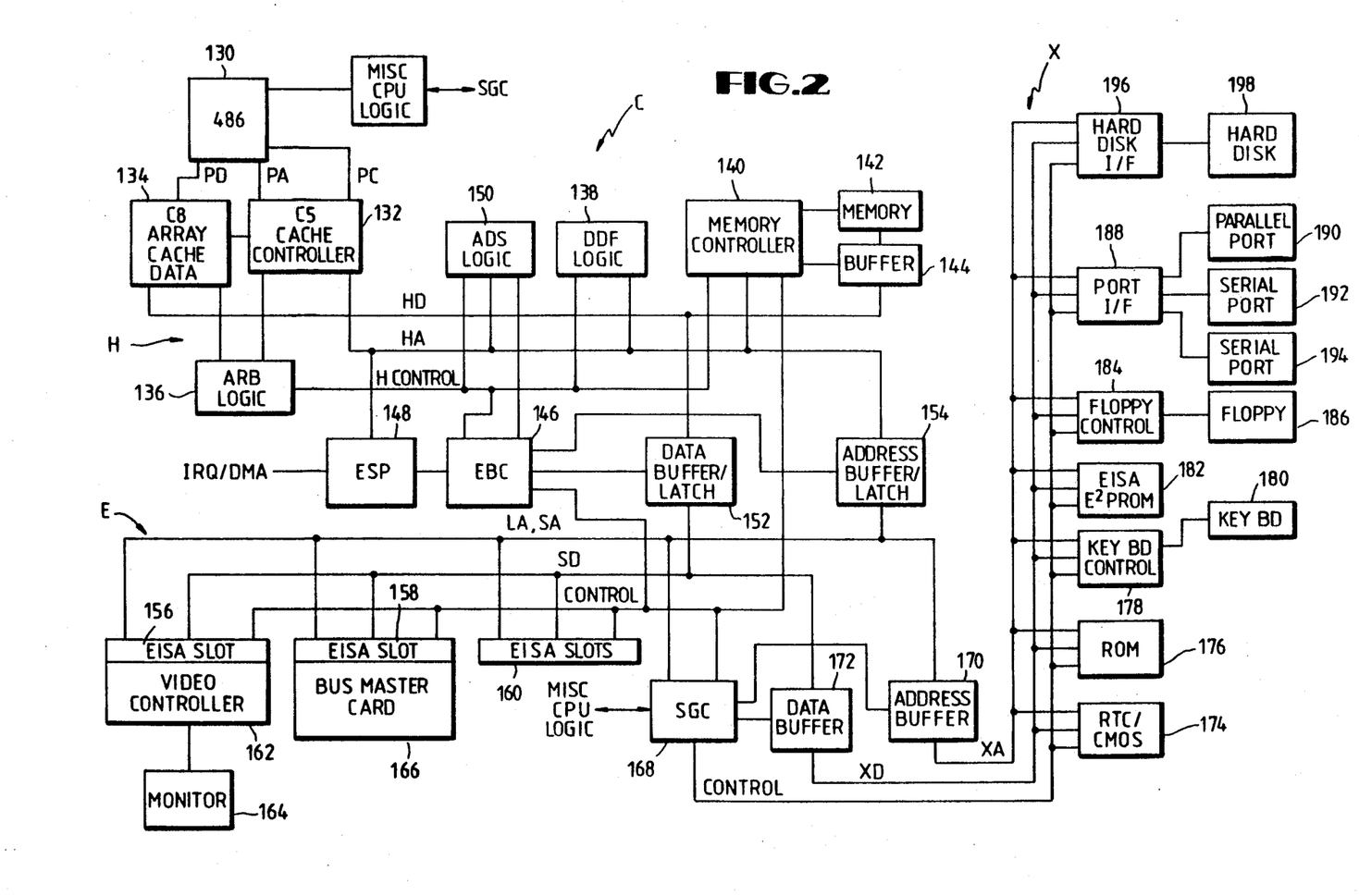
FIG. 2 is a block diagram of a computer system incorporating the present invention.

Referring now to FIG. 2, a computer system generally referred to by the letter C incorporating the present invention is shown. The foundation of a computer system C according to the present invention is a microprocessor 130, preferably the i486 from Intel Corporation (Intel). Connected to the microprocessor 130 is a cache subsystem comprising a cache controller 132, preferably the C5 or 82495 cache controller by Intel, and an array of cache data RAMs 134, preferably the C8 or 82490 data RAMs also from Intel. The microprocessor 130, the cache controller 132 and the cache data RAMs 134 are functionally connected and specified by Intel. To this end the processor data bus PD is connected to the data RAMs 134 and the processor address bus PA and the processor control bus signals PC are connected to the cache controller 132. The cache controller 132 and the cache data RAMs 134 are also connected by various control signals. Preferably the 50 MHz versions of the devices are utilized.

The cache controller 132 and the cache data RAMs 134 are coupled to a bus generally referred to as the host bus H which includes a host data bus HD portion, a host address bus HA portion and a host control bus HCONTROL portion. Arbitration logic 136 produces some control signals in the HCONTROL bus from signals provided by the cache controller 132 and the cache data RAMs 134. The HCONTROL bus includes signals such as the memory read or write signal, the memory or input/output signal, various address and data strobes and so on as commonly utilized by the various other elements in the computer system C.

Connected to the host bus H is a memory subsystem including data destination facility (DDF) logic 138, a memory controller 140, memory 142 and a memory data buffer 144. The DDF logic 138 provides address translation and memory module activation and is more completely described in U.S. patent application Ser. No. 431,666 filed Nov. 3, 1989 and in its European Patent Office counterpart having an application number of 90 311 749.7 and a filing date of Oct. 26, 1990, which was published on May 8, 1991, both of which are hereby incorporated by reference. The memory controller 140 provides the various control functions necessary to allow the various units operating on or over the host bus H to interact with the actual memory devices 142. The memory 142 is comprised of a series of page mode dynamic random access memories (DRAMs) arranged in an interleaved format. The memory controller 140 includes the necessary functions to control the operation of the DRAMs and of the data buffer 144.

In the preferred embodiment, the computer system C utilizes the EISA or Extended Industry Standard Architecture for the external bus. The EISA bus is generally referred to by the letter E in the Figure. The EISA bus E is comprised of several portions, the LA and SA address buses, the SD data bus and the control bus. A bus controller 146 referred to as the EBC, provides certain of the necessary control functions between the host bus H and the EISA bus E. Connected to the EBC 146 is the EISA system peripheral (ESP) 148, which includes various timers, the direct memory access (DMA) controller and the interrupt controller logic of the computer system C. Also connected to the EBC 146 is ADS or address strobe logic 150. The ADS logic 150 is used to convert certain differences in the various strobes from the cache controller 132 to those necessary for use by the EBC 146. The EBC 146 controls a data buffer/latch 152 connected between the host data bus HD and the external data bus SD and an address buffer/latch 154 connected between the host address bus HA and the external address buses LA and SA in the EISA bus E. Connected to the EISA bus E are a series of EISA slots 156, 158 and 160 according to the EISA convention. In the preferred embodiment, the EISA slot 156 is preferably a special slot having a pin adapted for special operations with a video controller 162. A monitor 164 is connected to the video controller 162. Additionally in the disclosed embodiment, one of the general purpose EISA slots 158 includes a bus mastering card 166 which operates according to the EISA specification. The bus mastering card allows high performance data transfers over the EISA bus E. As an example, the bus master card 166 may be a high performance disk controller which transfers information from the attached hard disk devices directly into the memory 142. This operation is controlled in part by the bus mastering card 166, in part by the EBC 146 and in part by the memory controller 140. It is noted that the bus master card 166 could be either an EISA bus master or an ISA bus master. The remaining EISA slots are generally referred to by the number 160 and in a typical design would include up to 6 slots for insertion of either other EISA cards or conventional ISA cards as readily available.

A fourth general bus referred to as the X bus is also present in the computer system C. The X bus is developed from the EISA bus E by means of a system glue chip (SGC) 168, which performs numerous address decoding operations; an address buffer 170 and a data buffer 172. The SGC 168 controls the operation of the data buffer 172 and the address buffer 170, as well as providing various strobes over an X control bus to the miscellaneous devices contained on the X bus. The first item contained on the X bus is a real time clock (RTC) 174, which contains the necessary CMOS memory and clock functions utilized in the computer system C. A read only memory (ROM) 176 includes the necessary basic operating software utilized in the computer system C and communicates over the X bus. A keyboard controller 178 is connected to the X bus and has connected to it a keyboard 180 to allow data entry. Optionally the keyboard controller 178 can include a second interface for a pointing device (not shown). An electrically erasable programmable read only memory (EEPROM) 182 is connected to the X bus to retain the extended set up information required for an EISA system relating to board configuration. A floppy controller 184 is connected to the X bus and has connected to it a floppy disk drive 186. A port interface circuit 188 is connected to the X bus and provides a parallel port 190 and two serial ports 192 and 194. Further, a hard disk interface 196 is connected to the X bus, with a hard disk 198 being connected to the interface 196. This list of peripheral devices is exemplary and numerous other peripheral devices could be developed either on the X bus or on the EISA bus E.

This description of the preferred embodiment of the computer system C is exemplary only and other variations in the computer system design could of course be developed.

Figure 3:
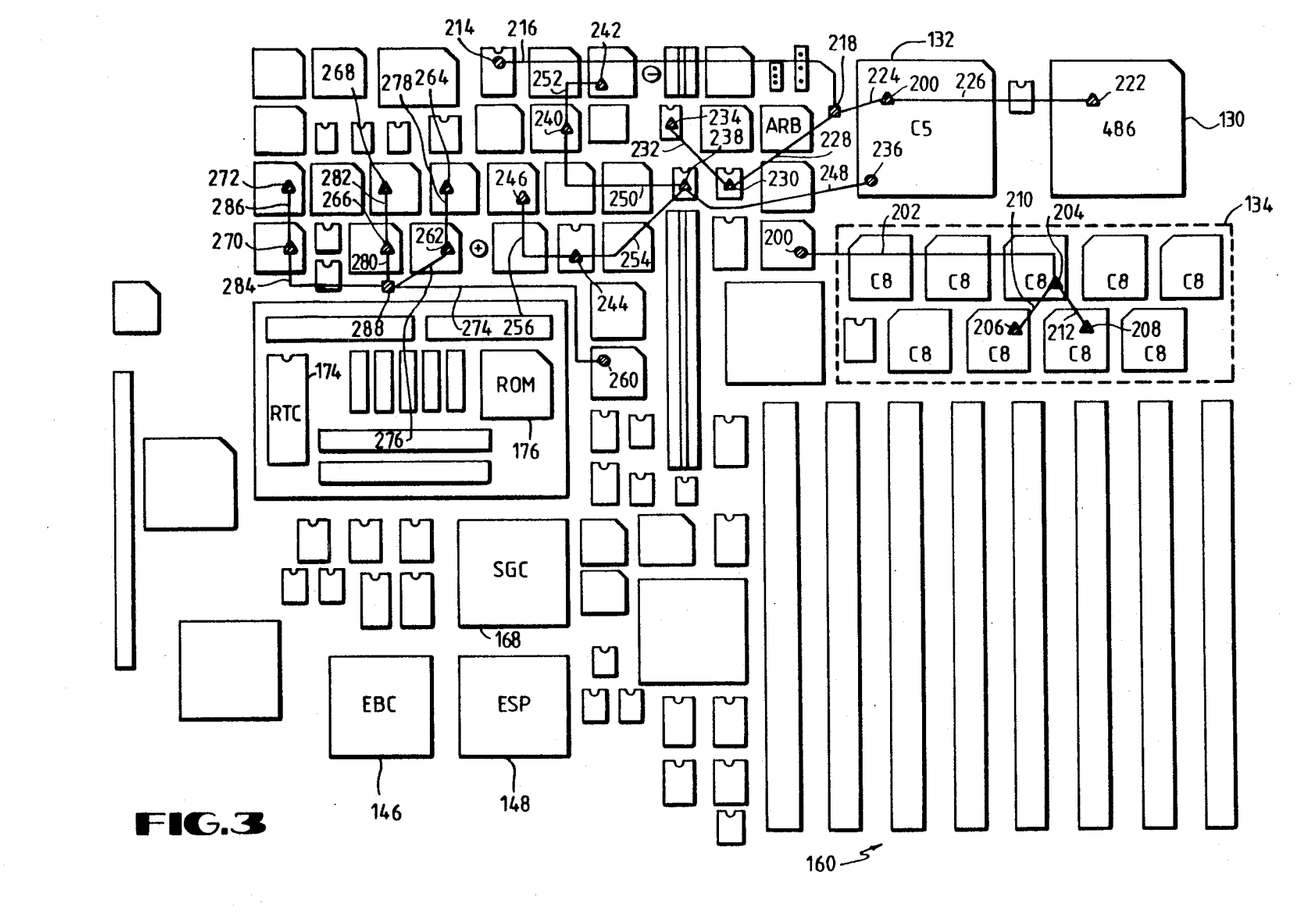
FIG. 3 is a block diagram of a printed circuit board of the computer system of FIG. 1 illustrating several signal nets routed according to the signal routing technique of the present invention.

Referring now to FIG. 3, a block diagram of the system printed circuit board (PCB) of the computer system C of FIG. 2 is shown illustrating approximate location of components mounted on the PCB and the signal routing techniques according to the present invention. It has been determined that the nets illustrated in FIG. 3 routed according to the signal routing technique of the present invention provide superior reduction of transmission line reflections at the preferable processor clock frequency of 50 MHz as compared to any of the prior art routing techniques shown in FIGS. 1A-1C. One node is shown wherein a source 200 is providing a signal to three loads 204, 206 and 208. A trace 202 is routed between the source 200 and the load 204, a trace 210 is routed between the load 204 and the load 206, and a trace 212 is routed between the load 204 and the load 208. Note that since there are an odd number of loads, the trace 202 is routed from the source 200 to the balanced load 204, and the remaining loads 206 and 208 are balanced around the load 204. Further note that the connection of the traces 210 and 212 is made at the terminal of the load 204. Also, a terminator is not required at either of the loads 206 or 208 since the transmission line reflections are reduced to an allowable level. The node comprising the source 200 and the loads 204, 206 and 208 as shown provides significantly superior results at high frequencies than the routing techniques of prior art as shown in FIGS. 1A-1C.

Another net is shown wherein a source 214 provides a signal to four loads 220, 222, 230 and 234. Since there are an even number of loads, a balanced junction 218, represented by a solid square, is provided wherein the loads 220, 222, 230 and 234 are connected or routed together so as to be balanced around the balanced junction 218. The balanced junction 218 is not a load but is an intersection or junction for the signal traces. It is determined in this particular embodiment of the present invention that the loads 220, 222, 230 and 234 be divided into two branches, one branch including the loads 220 and 222, and the other branch including the loads 230 and 234. In this manner, a trace 216 is routed from the source 214 to the balanced junction 218, the first branch is formed by a trace 224 routed between the junction 218 and the load 220 and a trace 226 routed between the loads 220 and 222, while a second branch is formed by a trace 228 routed between the junction 218 and the load 230 and a trace 232 routed between the loads 230 and 234. Note that there are two branches connected to the balanced junction 218 so that the loads are distributed in two opposing branches on either side of the balanced junction 218, wherein the loads 230 and 234 comprise one branch, and the loads 220 and 222 comprise another branch. Further note that the traces such as the traces 224 and 226 in a branch are connected at the load, such as the load 220, so that a serial or daisy-chain arrangement develops.

Another net is illustrated including a source 236 and five loads 238, 240, 242, 244 and 246. Since there are an odd number of loads, a signal trace 248 is routed between the source 236 and the load 238, wherein the load 238 also serves as a balanced junction and so is a balanced load, and the remaining loads 240-246 are balanced around the balanced load 238. The loads 240-246 are divided into two branches with two loads for each branch. A signal trace 250 is routed between the load 238 and the load 240, and a signal trace 252 is routed between the load 240 and the load 242 to form the first branch. A signal trace 254 is routed between the load 238 and the load 244 and a signal trace 256 is routed between the load 244 and the load 246 to form the second branch. In this manner, the net including the source 236 is similarly balanced as the net including the source 214 except that the balanced load 238 is used instead of the balanced junction 218.

A net including a source 260 and six loads 262, 264, 266, 268, 270 and 272 is also shown. Since there are an even number of loads, a balanced junction 288 is included and the loads 262-272 are divided into three branches, two loads per branch. A trace 274 is routed from the source 260 to the balanced junction 288. The six loads are distributed in three equivalent branches wherein the first branch comprises the loads 262 and 264, the second branch comprises the loads 266 and 268, and a third branch comprises the loads 270 and 272. Therefore, a trace 276 is routed between the balanced junction 288 and the load 266 and a trace 278 is routed between the load 266 and the load 264 forming the first branch. Likewise, a trace 280 is routed between the balanced junction 288 and the load 266 and a trace 282 is routed between the load 266 and the load 268 forming the second branch, and a trace 284 is routed between the balanced junction 288 and the load 270 and a trace 286 is routed between the load 270 and the load 272 forming the third branch. Again, the source 260 provides a signal on trace 274 to the balanced junction 288 and the six loads are balanced in three equivalent branches around the balanced junction 288.

Figure 4:
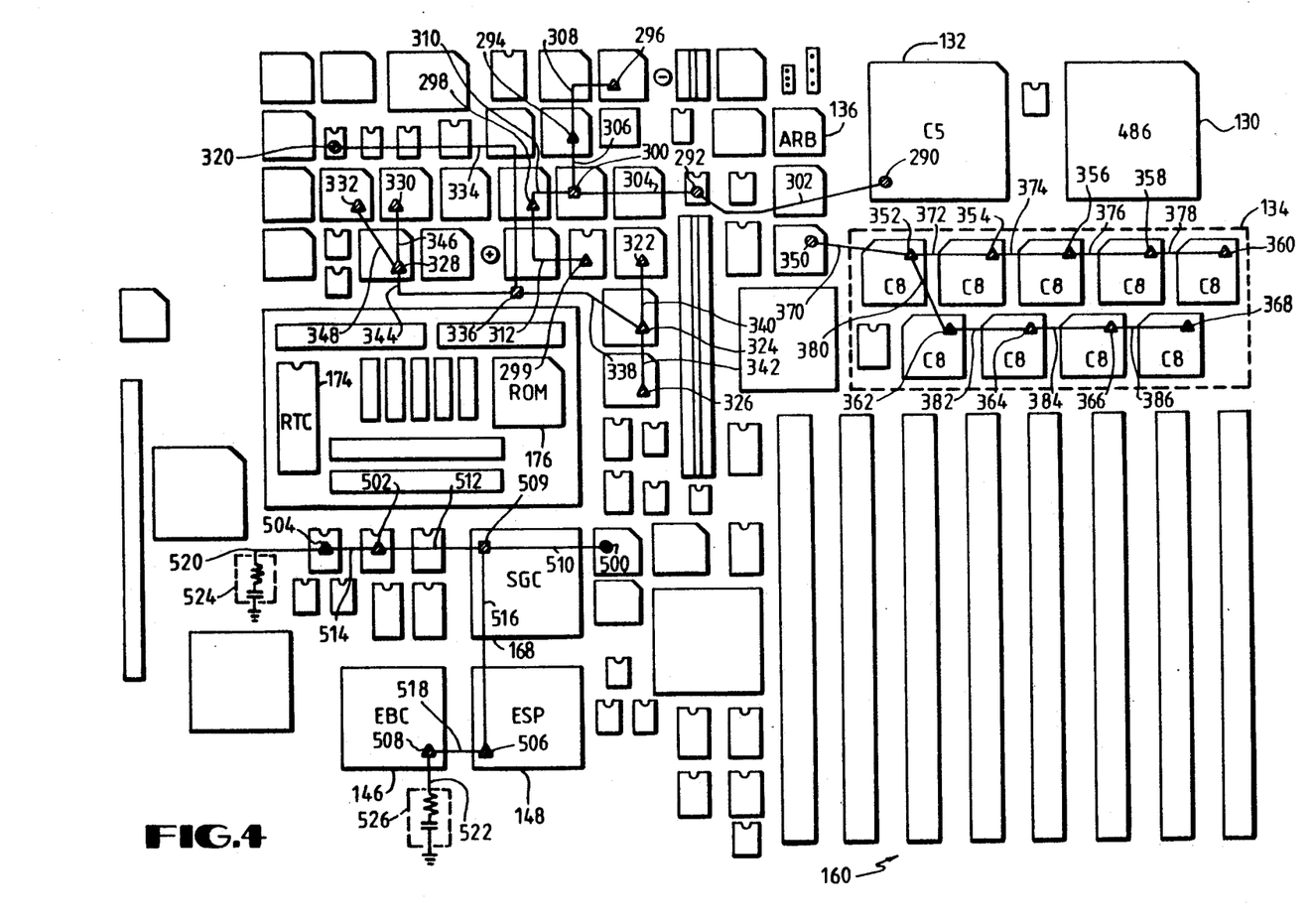
FIG. 4 is the printed circuit board of FIG. 3 illustrating more nets routed according to the signal routing techniques of the present invention.

Referring now to FIG. 4, the PCB of FIG. 3 is shown illustrating more routed traces according to the present invention. The first net is similar to the net being driven by the source 214 in FIG. 3, except that it includes two sources 290 and 292 rather than one, wherein the sources 290 and 292 are driving four loads 294, 296, 298 and 299. Only one of the sources 290 and 292 is driving the loads 294-299 at any given time. A signal trace 302 is routed between the source 290 and the other source 292. A signal trace 304 is routed between the source 292 and a balanced junction 300, and the remaining four loads 294, 296, 298 and 299, which is an even number of loads, are balanced around the balanced junction 300. The two loads 294 and 296 comprise one branch and the loads 298 and 299 comprise another branch. A signal trace 306 is routed between the balanced junction 300 and the load 294 and a trace 308 is routed between the loads 294 and 296. Also, a trace 310 is routed between the balanced junction 300 and the load 298 and a trace 312 is routed between the loads 298 and 299. Note that since there are an even number of loads, the sources 290 and 292 are still routed to a balanced junction, although in this particular embodiment, the two sources 290 and 292 are located on the "feeder trace" comprising the traces 302 and 304. If the source 290 is driving the net and the source 292 is not, then the traces 302 and 304 act together as one longer trace to the balanced junction 300, so that the net is similar to the net being driven by the source 214 shown in FIG. 3. Likewise, if the source 292 is driving the net and the source 290 is not, only the trace 304 is used to provide the signal to the junction 300. This example is included to show the versatility of the routing technique of the present invention wherein two mutually exclusive sources may be routed to drive the same loads of a net.

An alternative form of routing is shown to connect six loads to a single source. A source 320 is providing a signal to six loads 322, 324, 326, 328, 330 and 332. A signal trace 334 is routed between the source 320 and a balanced junction 336 since there is an even number of loads. The loads are divided into two separate branches of three loads each, wherein the two branches are balanced around and connected to the balanced junction 336. The loads 322, 324 and 326 comprise one main branch and the loads 328, 330 and 332 comprise the other main branch. A signal trace 338 is routed between the balanced junction 336 and the load 324, a trace 340 is routed between the load 324 and the load 322 and a trace 342 is routed between the load 324 and the load 326. Note that the loads 322 and 326 are balanced on either side of the load 324, the load 324 thus becoming a second level balanced load and the loads 322 and 326 being on subbranches. Similarly, a signal trace 344 is routed between the balanced junction 336 and the load 328, a signal trace 346 is routed between the load 328 and the load 330 and another trace 348 is routed between the load 328 and the load 332. Again, the loads 330 and 332 are balanced on either side of the load 328, just as the loads 330 and 332 are balanced around the load 328, illustrating the symmetry between the two branches. It is important that each of the branches are routed in a symmetrical fashion with respect to the balance point, such as the balanced junction 336, in order to achieve a balanced net. As long as the loads are balanced about a center point, significant transmission line reflections at high frequencies are substantially reduced.

Another net is shown routing between a single source 350 and nine loads 352, 354, 356, 358, 360, 362, 364, 366 and 368. Since there are an odd number of loads, a signal trace 370 is routed between the source 350 and a balanced load 352. A first branch comprising the loads 354–360 and a second branch comprising the loads 362–368 are connected to the balanced load 352. To form the first branch, a signal trace 372 is routed between the balanced load 352 and the load 354, a trace 374 is routed between the loads 354 and 356, a trace 376 is routed between the loads 356 and 358 and a trace 378 is routed between the loads 358 and 360. Likewise, to form the second branch, a trace 380 is routed between the balanced load 352 and the load 362, a trace 382 is routed between the loads 362 and 364, a trace 384 is routed between the loads 364 and 366, and a trace 386 is routed between the loads 366 and 368. Therefore, two equal branches, each comprising four loads, are connected to and balanced around the balanced load 352.

Figure 5A:
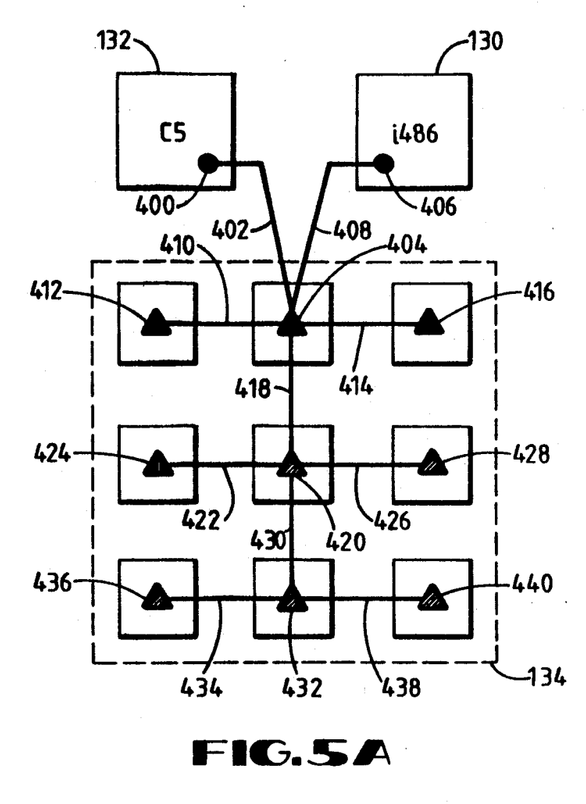
FIGS. 5A and 5B are block diagrams illustrating alternatives for a more complex example of the signal routing techniques of the present invention.
Figure 5B:
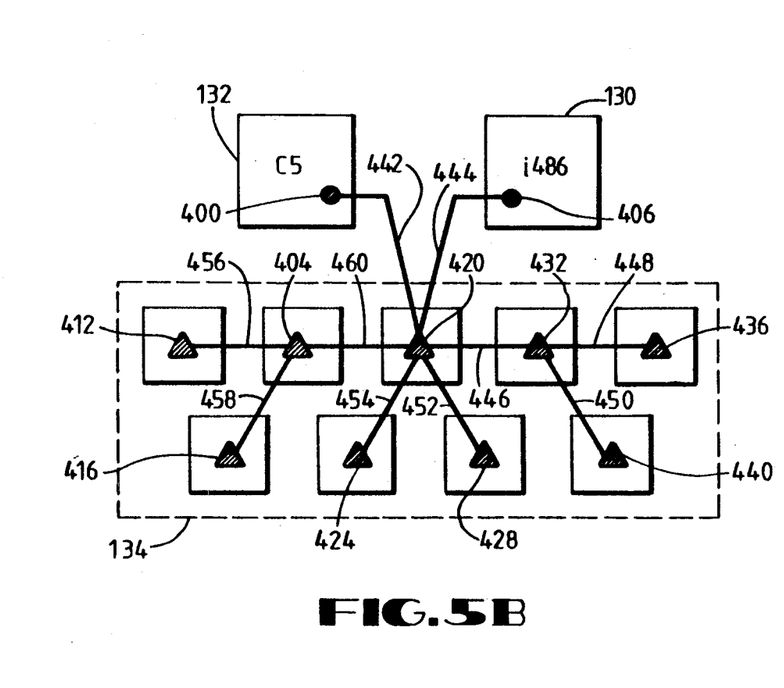

Referring now to FIGS. 5A and 5B, two alternate forms of a more complex example of the present invention are shown. The routing techniques illustrated in FIGS. 5A and 5B vary somewhat from the techniques illustrated in FIGS. 3 and 4. Nonetheless, it has been shown that the routing techniques as illustrated in FIGS. 5A and 5B provide improved signal integrity and reduced transmission line reflections. Referring now to FIG. 5A, the C5 cache controller 132 and the 486 microprocessor or CPU 130 each provide a source signal to nine loads of the C8 cache array 134 arranged in a 3×3 configuration. The C5 cache controller 132 provides a source signal from a source 400 and the CPU 130 provides a source signal from a source 406. Only the C5 cache controller 132 or the CPU 130 is providing a signal to the C8 cache array 134 at any given time. A signal trace 402 is routed between the source 400 and a pseudo-balanced load 404. Again, since there are an odd number of loads, the source 400 is routed to a load, here being the load 404. A signal trace 408 is routed between the source 406 and the pseudo-balanced load 404. A signal trace 410 is routed between the load 404 and a load 412, a signal trace 414 is routed between the load 404 and a load 416 and another signal trace 418 is routed between the load 404 and a load 420. A signal trace 422 is routed between the load 420 and a load 424, a signal trace 426 is routed between the load 420 and a load 428, and a signal trace 430 is routed between the load 420 and a load 432. Finally, a signal trace 434 is routed between the load 438 and a load 436 and a trace 438 is routed between the load 432 and a load 440.

The load 432 forms a balanced load with the loads 436 and 440. The balanced load 432 is connected to a pseudo-balanced load 420, with loads 424 and 428. The pseudo-balanced load 420 is connected to the pseudo-balanced load 404, with loads 412 and 416. The pseudo-balanced load 404 is connected to the sources 400 and 406.

Referring now to FIG. 5B, an alternative form of the signal routing technique of the present invention is shown wherein the components of the C8 cache array 134 are arranged in a 5 and 4 configuration. Thus, the same loads 404, 412, 416, 420, 424, 428, 432, 436 and 440 are routed together using a different pattern from the one shown in FIG. 5A, but still conforming to the alternate routing technique of the present invention. A signal trace 442 is routed between the source 400 and the load 420 and a trace 444 is routed between the source 406 and the load 420. The load 420 now provides the pseudo balanced load of the 5 and 4 configuration. Again, only the source 400 or the source 406 provides a signal to the loads at any one time. A signal trace 446 is routed between the loads 420 and 432, a signal trace 448 is routed between the loads 432 and 436, and a signal trace 450 is routed between the loads 432 and 440. A signal trace 452 is routed between the loads 420 and 428 and a signal trace 454 is routed between the loads 420 and 424. A signal trace 460 is routed between the loads 420 and 404, a signal trace 458 is routed between the loads 404 and 416, and a signal trace 456 is routed between the loads 404 and 412. The loads 412, 404 and 416 comprise a first subbranch and the loads 432, 436 and 440 comprise a second subbranch.

The two subbranches are connected, in a balanced arrangement, to the balanced load 420. Additionally, the loads 424 and 428 are connected in a balanced fashion to the balanced load 420.

In either case, the balanced routing techniques according to the present invention provides improved signal integrity over prior art routing schemes by reducing the amount of transmission line reflections.

The signal routing technique of the present invention may be further enhanced by connecting terminators, such as the ac terminator 62 (FIG. 1B), to one or more of the branches of a net so that the total impedance of all of the branches matches the impedance of the feeder trace routed between the source and the balanced junction. For each of the nets routed according to the present invention described above, the transmission line reflections are generally reduced to an acceptable level but are not completely neutralized. Also, the sources preferably do not provide a significant amount of energy beyond that necessary to meet rise time and load requirements, which could otherwise increase the transmission line reflections. Increased transmission line reflection due to a higher energy source may cause poorer signal integrity even though the net is routed according to the present invention.

Referring again to FIG. 4, another net is shown wherein a source 500 is providing a signal to four loads 502, 504, 506 and 508. Since there are an even number of loads, a trace 510 is routed from the source 500 to a balanced junction 509, and the loads 502-508 are divided into two branches of two loads each. Thus, a trace 512 is routed between the balanced junction 509 and the load 502, a trace 514 is routed between the loads 502 and 504, a trace 516 is routed between the balanced junction 509 and the load 506, and a trace 418 is routed between the loads 506 and 508. Even though this net is routed according to the present invention, the exemplary source 500 provides a significant amount of additional energy over that of the previous sources which increases the otherwise negligible transmission line reflection energy, resulting an appreciable level of signal noise. The signal provided by the source 500 is, therefore, compromised even though the net is routed according to the present invention.

The characteristic impedance, referred to as $Z_0$, of the feeder trace 510 routed between the source 500 and the balanced junction 509, is approximately 60 ohms in the preferred embodiment. Each of the traces 512, 514, 516 and 518 have a characteristic capacitance which is referred to as $C_0$. Each of the loads 502-508 add loading capacitance to the branch to which they are connected. The capacitance of the loads connected to a branch, combined with the characteristic capacitance of the routed traces, can be combined into a lumped total capacitance, referred to as $C_D$, which is the total capacitance of the branch. The impedance of a branch, as loaded by one or more loads connected to that branch, is determined by the following equation:

$$Z_0' = \frac{Z_0}{\sqrt{1 + C_D/C_0}}$$

where $Z_0'$ is the resulting impedance of the branch. Note that the addition of loads to a branch increases the total capacitance $C_D$ of that branch, which lowers the impedance of that branch. For example, assume that the characteristic capacitance, $C_0$, of the traces 512 and 514 is 50 picofarads (pF) and that the loads 502 and 504 add load capacitance such that the total capacitance, $C_D$, of the branch comprising the loads 502 and 504 is 150 pF. The impedance of the branch comprising the loads 502 and 504, as calculated using the above equation, is then 30 ohms. If the capacitance of the loads 506 and 508 is substantially equal to the loads 502 and 504, and if the traces 516 and 518 have the same characteristic capacitance, $C_0$, of 50 pF as the traces 512 and 514, then the impedance of the branch comprising the loads 506 and 508 is also 30 ohms. In an actual embodiment, the capacitances of the loads may vary. However, in this example they are assumed equal for simplicity and clarity.

The two branches above are electrically connected in parallel between the balanced junction 509 and ground. Therefore, the total impedance of the branches, referred to as $Z_B$, is 30 ohms in parallel with 30 ohms which is 15 ohms. Since the feeder trace 510 has an impedance of 60 ohms, and the total impedance of the branches, $Z_B$, is 15 ohms, there is an impedance mismatch between the trace 510 and the two branches, causing increased transmission line reflections on the net.

In order to reduce the transmission line reflections to an acceptable level, an ac terminator 524, similar to the ac terminator 62, is added to one branch, and an ac terminator 526 is added to the other branch to match the impedance between the trace 510 and the branches including the loads 502-508. A trace 520 is routed between the load 504 and the terminator 524 and a trace 522 is routed between the load 508 and the terminator 526. Both terminators 524 and 526 are coupled to ground. The terminators 524 and 526 add a series impedance to the respective branches to which they are coupled. The internal resistance and capacitance of the terminator 524 and 526 are chosen to add enough impedance to each branch, respectively, so that the parallel combination of the two branches is subsequently equal to the impedance, $Z_0$, of the feeder branch 510. In the example above, the impedance of each of the branches is 30 ohms without the terminators 524 and 526, then the impedance of the terminators 524 and 526 must each be approximately 90 ohms so that the impedance of each trace will be 30+90=120 ohms.

The parallel combination of the two 120 ohm branches as terminated, is equal to 60 ohms which matches the impedance of the feeder trace 510. Note that if the capacitances of the loads varied such that the impedances of the branches were not equal, the resistance and capacitance of the terminators 524 and 526 are easily selected to provide matched impedances.

Again, the routing techniques of the present invention reduces transmission line reflections which significantly lessens the need for terminators. Nonetheless, terminators may be used on one or more of the branches to match the impedances around the balance junction of a net to further reduce transmission line reflections and enhance the capability of the routing technique of the present invention.

To summarize the signal routing technique of the present invention, the source is routed to a balanced junction and the loads are organized into equal branches which are balanced around the balanced junction to provide improved signal integrity for an electronic system. If an odd number of loads exist, one of the loads provides the balanced junction to become a balanced load, and the remaining loads are separated into equal branches and connected to the balanced load. In an alternative embodiment, the loads are organized into a plurality of equal branches wherein each branch comprises an equal and odd number of serially routed loads. The center loads of each branch are serially routed together and the source is connected to one of the center loads which acts as a pseudo balanced load. Terminators may be used for impedance matching purposes if the transmission line reflections appearing on a net are significant even though the net is routed according to the present invention.

The foregoing disclosure and description of the invention are illustrative and explanatory thereof, and various changes in the size, shape, materials, components, circuit elements, wiring connections and contacts, as well as in the details of the illustrated circuitry and construction may be made without departing from the spirit of the invention.

We claim:

1. An electronic system, comprising:
   a circuit board for mounting electrical components and for routing electrical conductors;
   an electrical component mounted on said circuit board having a source terminal for generating an electrical signal;
   a plurality of electrical components mounted on said circuit board, each said component having at least one load terminal for receiving said electrical signal wherein there is an odd number of said load terminals;
   an electrical conductor connected to said source terminal and routed and connected to one of said load terminals, wherein said one load terminal forms a d load terminal, the remaining load terminals being grouped into a plurality of branches, wherein each said branch comprises an equal number of load terminals; and
   for each one of said branches, an electrical conductor serially routed and connected from said balanced load terminal to each load terminal in said branch without any branching.

2. An electronic system, comprising:
   a circuit board for mounting electrical components and for routing electrical conductors;
   an electrical component mounted on said circuit board having a source terminal for generating an electrical signal;
   a conductive balanced junction point;
   an electrical conductor connected to said balanced junction point and routed and connected to said source terminal;
   a plurality of electrical components mounted on said circuit board, each said component having at least one load terminal for receiving said electrical signal, wherein there is an even number of said load terminals, said load terminals being grouped into at least three branches wherein each one of said branches comprises an equal number of load terminals; and
   for each one of said branches, an electrical conductor serially routed and connected from said balanced junction point to each load terminal in said branch without any branching.

3. An electronic system, comprising:
   a circuit board for mounting electrical components and for routing electrical conductors;
   an electrical component mounted on said circuit board having a source terminal for generating an electrical signal;
   a conductive balanced junction point;
   an electrical conductor connected to said balanced junction point and routed and connected to said source terminal;
   a plurality of electrical components mounted on said circuit board, each said component having at least one load terminal for receiving said electrical signal, wherein there is an even number of said load terminals, said load terminals being grouped in a plurality of branches wherein each said branch comprises an equal number of load terminals; and
   for each one of said branches, an electrical conductor connected to said balanced junction point and routed and connected to a first load terminal of each said branch;
   for each one of said branches, the remaining load terminals being grouped into a plurality of subbranches, wherein each subbranch comprises an equal number of load terminals;
   for each one of said subbranches an electrical conductor serially routed and connected from said first load terminal of said branch to each load terminal in said subbranch without any branching.

4. An electronic system, comprising:
   a circuit board for mounting electrical components and for routing electrical conductors;
   an electrical component mounted on said circuit board having a source terminal for generating an electrical signal;
   a plurality of electrical components mounted on said circuit board, each said component having at least one load terminal for receiving said electrical signal wherein there is an odd number of said load terminals;
   an electrical conductor connected to said source terminal and routed and connected to one of said load terminals, wherein said one load terminal forms a balanced load terminal, the remaining load terminals being grouped into a plurality of branches, wherein each said branch comprises an equal number of load terminals;
   for each one of said branches, an electrical conductor connected to said balanced load and routed and connected to a first load terminal of each said branch;
   for each one of said branches, the remaining load terminals being grouped into a plurality of subbranches, wherein each subbranch comprises an equal number of load terminals; and
   for each one of said subbranches an electrical conductor serially routed and connected from said first load terminal of said branch to each load terminal in said subbranch without any branching.

5. The electronic system of claim 4, further comprising:
   a further plurality of electrical components mounted on said circuit board, each one of said further plurality of electrical components having at least one load terminal for receiving said electrical signal, wherein there is an even number of said load terminals of said further plurality of electrical components, said load terminals of said further plurality of electrical components being groups into a plurality of further branches, wherein each said further branch comprises an equal number of load terminals;

for each one of said further branches, an electrical conductor connected to said balanced load terminal and serially routed and connected to each load terminal in said further branch without any branching.

6. An electronic system, comprising:
a circuit board for mounting electrical components and for routing electrical conductors;
at least one electrical component mounted on said circuit board having a source terminal for generating an electrical signal;
a further plurality of electrical components mounted on said circuit board, each one of said further plurality of electrical components having at least one load terminal for receiving said electrical signal wherein there is an odd number of said load terminals of said further plurality of electrical components and wherein one of said load terminals is a first balanced load terminal;
a plurality of said remaining load terminals being grouped into an even number of first branches, each of said first branches having an equal number of load terminals;
for each one of said branches, an electrical conductor connected from said first branches, an electrical conductor connected from said first balanced load terminal and serially routed and connected to each said load terminal in said first branch without any branching;
an electrical conductor connected to said first balanced load terminal and routed and connected to a second balanced load terminal;
a plurality of said remaining load terminals being grouped into an even number of second branches, each of said second branches having an equal number of load terminals;
for each one of said second branches, an electrical conductor connected from said second balanced load terminal and serially routed and connected to each said load terminal in said second branch without any branching;
an electrical conductor connected to said second balanced load terminal and routed and connected to a third balanced load terminal;
a plurality of said remaining load terminals being groups into an even number of third branches, each of said third branches having an equal number of load terminals;
for each one of said third branches, an electrical conductor connected from said third balanced load terminal and serially routed and connected to each said load terminal in said third branch without any branching; and
an electrical conductor routed and connected from said first balanced load terminal to said signal source terminal.

* * * * *

UNITED STATES PATENT AND TRADEMARK OFFICE
CERTIFICATE OF CORRECTION

PATENT NO.   :   5,175,515
DATED        :   DECEMBER 29, 1992
INVENTOR(S)  :   MICHAEL G. ABERNATHY, ET AL.

It is certified that error appears in the above-identified patent and that said Letters Patent is hereby corrected as shown below:

Title page, item [75] inventor, please change "Thomas" to --Thoma--.

In Col. 13, line 34, please change "a d" to --a balanced--.

In Col. 15, Line 27, after "said" insert --first--.

In Col. 16, Line 19, please change "groups" to --grouped--.

Signed and Sealed this

Ninth Day of November, 1993

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,175,515
DATED : December 29, 1992
INVENTOR(S) : Michael G. Abernathy et al.

It is certified that error appears in the above-identified patent and that said Letters Patent is hereby corrected as shown below:

Column 12,
Line 46, the sentence starting "The parallel combination" should not be a new paragraph, but be a part of the previous paragraph.

Column 14,
Line 67, delete "groups" and insert therefor -- grouped --.

Signed and Sealed this

Twenty-fifth Day of October, 2005

JON W. DUDAS
*Director of the United States Patent and Trademark Office*